(12) United States Patent
Johnston et al.

(10) Patent No.: US 7,071,126 B2
(45) Date of Patent: Jul. 4, 2006

(54) DENSIFYING A RELATIVELY POROUS MATERIAL

(75) Inventors: Steven W. Johnston, Portland, OR (US); Kevin P. O'Brien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/101,688

(22) Filed: Apr. 8, 2005

(65) Prior Publication Data

US 2005/0181631 A1 Aug. 18, 2005

Related U.S. Application Data

(63) Continuation-in-part of application No. 10/439,154, filed on May 15, 2003, now abandoned.

(51) Int. Cl.
*H01L 21/31* (2006.01)
*H01L 21/469* (2006.01)

(52) U.S. Cl. ............... 438/783; 257/E21.038; 257/E21.278

(58) Field of Classification Search ......... 438/783
See application file for complete search history.

(56) References Cited

U.S. PATENT DOCUMENTS 5,461,003 A * 10/1995 Havemann et al. ......... 438/666
6,156,651 A * 12/2000 Havemann .................. 438/674
6,159,842 A * 12/2000 Chang et al. ............... 438/622
6,171,951 B1 * 1/2001 Lee et al. ................... 438/640
6,475,929 B1 * 11/2002 Gabriel et al. ............. 438/783
6,492,256 B1 * 12/2002 Lee et al. ................... 438/619
2005/0272237 A1 * 12/2005 Hautala et al. ............. 438/597

OTHER PUBLICATIONS

Veeco Instruments Inc. Press Release Mar. 6, 2002; http://www.epion.com/veeco_press_release.htm.*
"Interconnect MLMA006: Advanced Barriers," Greg Book, Interconnect Program Advisory Group Meeting, International Sematech, Sep. 2002.
"Fundamental Studies of Barriers for Copper-based Interconnects, " with Executive Summary, J. G. Ekerdt, Y. M. Sun, and J. M. White, Monthly Report for Project MLMA006—Oct. 2002, International Sematech, Nov. 2002.
"Interconnect MLMA019," Greg Book, Interconnect Program Advisory Group Meeting, International Sematech, Feb. 2003.
"Pore Sealing for JSR5109," Somit Joshi with Ken Hu, Li Chen, Brian White, Paul Gillespie, and Greg Book, MLM PAG: MLMA011, Module Intgration, International Sematech, Feb. 2003.

* cited by examiner

*Primary Examiner*—Fernando L. Toledo
(74) *Attorney, Agent, or Firm*—Trop, Pruner & Hu, P.C.

(57) ABSTRACT

An interlayer dielectric may be exposed to a gas cluster ion beam to densify an upper layer of the interlayer dielectric. As a result, the upper layer of the interlayer dielectric may be densified without separate deposition steps and without the need for etch stops that may adversely affect the capacitance of the overall structure.

17 Claims, 3 Drawing Sheets

DENSIFYING A RELATIVELY POROUS MATERIAL

This is a continuation of prior application Ser. No. 10/439,154, filed May 15, 2003 now abandoned.

BACKGROUND

This invention relates generally to processes for manufacturing semiconductor integrated circuits.

In a variety of different processes, it may be desirable to form what is called a hard mask. A hard mask is a mask that may be utilized as an etching mask for subsequent process steps. For example, in the damascene process, a hard mask may be formed that prevents etched vias from extending through the hard mask. The hard mask may be utilized to enable an unlanded via integration scheme.

One problem with hard masks is that they may require an extra processing step. Basically, a separate hard mask may be deposited on top of a previously deposited material, such as a low dielectric constant film. The use of such hard mask may increase etch complexity due to the nature of the stack, including the resist, hard mask and underlying film. In addition, moisture may infiltrate through the hard mask. The infiltrated moisture, for example, may increase the capacitance contributed by a low dielectric constant film.

Thus, there is a need for better ways to form a hardmask.

DETAILED DESCRIPTION

Figure 1:
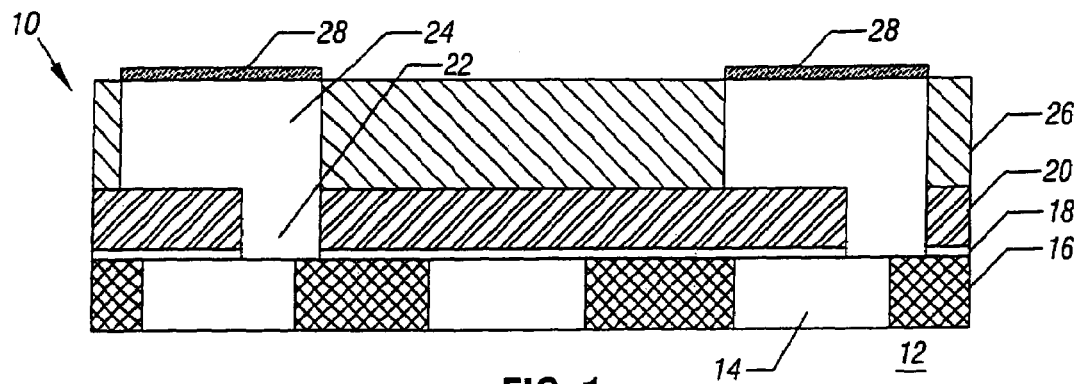
FIG. 1 is an enlarged, cross-sectional view of one embodiment of the present invention in the course of manufacture.

Referring to FIG. 1, a substrate 12 may be defined with the appropriate active and passive components, such as the metal elements 14 and the dielectric layer 16. A masking layer 18 may then be deposited. A dielectric film 20 may be deposited over the layer 18. The dielectric film 20 may be followed by a second interlayer dielectric film 26 in one embodiment.

Lithography, etching, and cleaning may be utilized to form trenches or vias through the dielectric films 26 and 20 using a damascene or dual damascene approach. Degassing, cleaning, barrier deposition, and seed deposition of the dielectric material may follow as desired. The resulting trenches may be filled with conductive material 22 and 24 using electroplating or any other fill technology.

The resulting wafer may be planarized down to the top of the dielectric film 26 by chemical mechanical polishing (CMP) or other planarization technology. If desired, deposition of a thin copper capping film 28 may be done using chemical vapor deposition, atomic layer deposition, or electroless methods to create a thin, continuous capping film.

Figure 2:
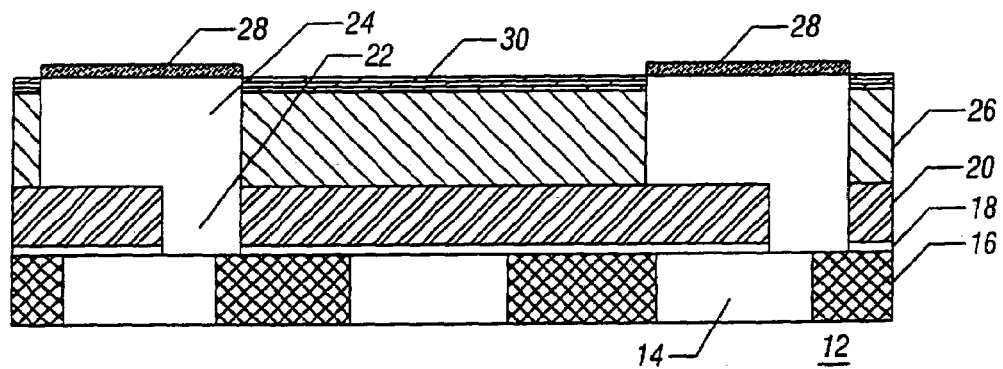
FIG. 2 is an enlarged, cross-sectional view of the embodiment as shown in FIG. 1 at a subsequent stage of manufacture.

The film 26 may be modified by the addition of carbon to form carbon-doped oxide (CDO) film. Other films 26 may also be used including porous silicon, spin-on glass, polymers, and other low dielectric constant materials. Then, as shown in FIG. 2, the exposed film 26 may be bombarded with a gas clustered ion beam. As a result of the mass and energy of the clustered ions used to bombard the film 26, the upper layer 30 of the film 26 may be densified. The capping film 28 is not substantially affected by the densification. In effect, the bombarding clustered ions actually compress the atomic structure of the exposed film 26. In one embodiment, a relatively porous material can be converted to a substantially non-porous hard mask.

Figure 3:
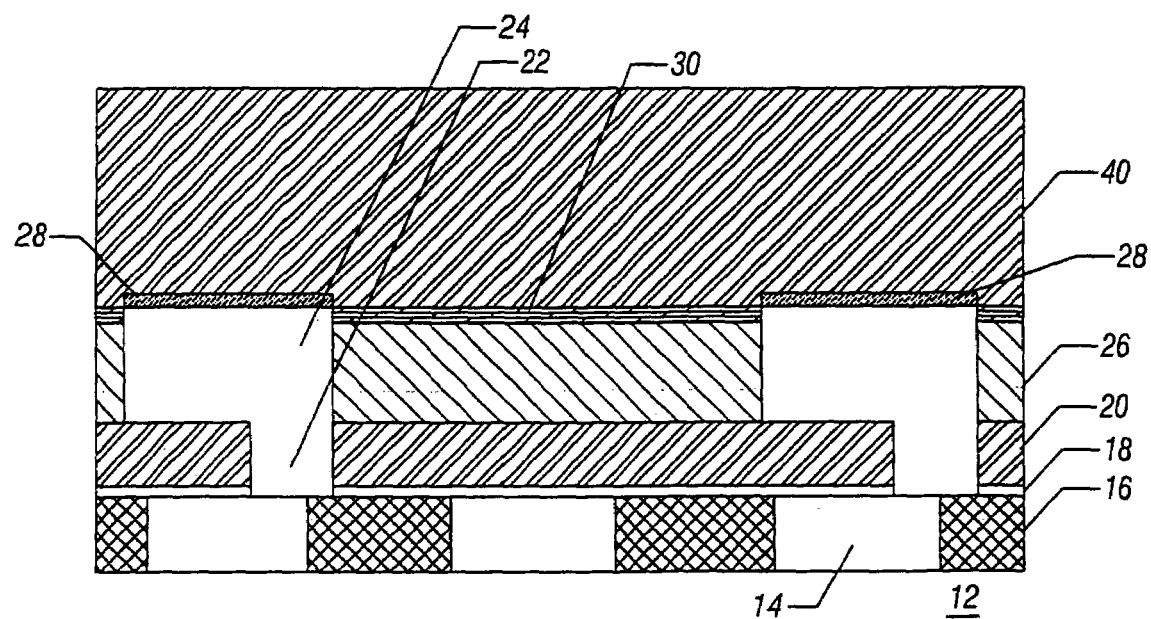
FIG. 3 is an enlarged, cross-sectional view of the embodiment as shown in FIG. 1 at a subsequent stage of manufacture in accordance with one embodiment of the present invention.
Figure 4:
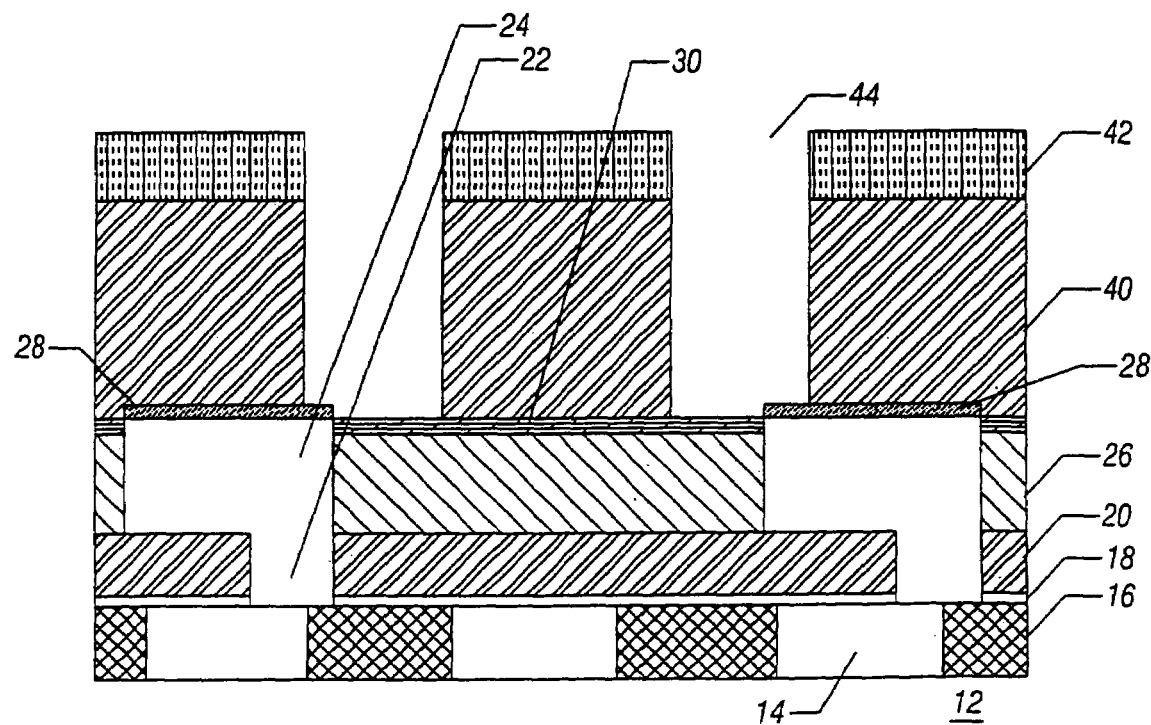
FIG. 4 is an enlarged, cross-sectional view of the embodiment shown in FIG. 1 at a subsequent stage of manufacture in accordance with one embodiment of the present invention.

Thereafter, another low dielectric constant interlayer dielectric layer 40 may be deposited in accordance with the damascene or dual damascene approach as shown in FIG. 3. The masking layer 42 may be formed and patterned to the desired trench characteristics as shown in FIG. 4. The masking layer 42 may then be used as a mask to pattern the layer 40 to form additional trenches for forming an additional layer of metal interconnects. Again, the metal interconnects may be arranged in an unlanded via configuration to repeat the sequence described in connection with FIGS. 1 and 2. In one application, the etched vias 44 may be filled with a sacrificial light activated material. The resulting structure may be covered by another masking layer, trenches may be etched, and then the sacrificial light activated material is etched to leave behind a trench and via that are filled with the material 22, 24. The techniques described herein can also be used to form embedded etch stops and to densify the bottom of trenches. Any surface layer may be converted in a directional fashion as described herein.

In another embodiment of the present invention, a similar process sequence to that described above may be utilized, except that a previously deposited, porous hard mask may be densified. Subsequent steps can then be built up to form multi-levels of vias and interconnects, all using the densified hard mask procedure described herein. As another example, a non-hermetic etch stop may have its top surface densified while the bulk of a silicon carbide etch stop is not altered. As a result, a low dielectric constant may be preserved for the material.

Figure 5:
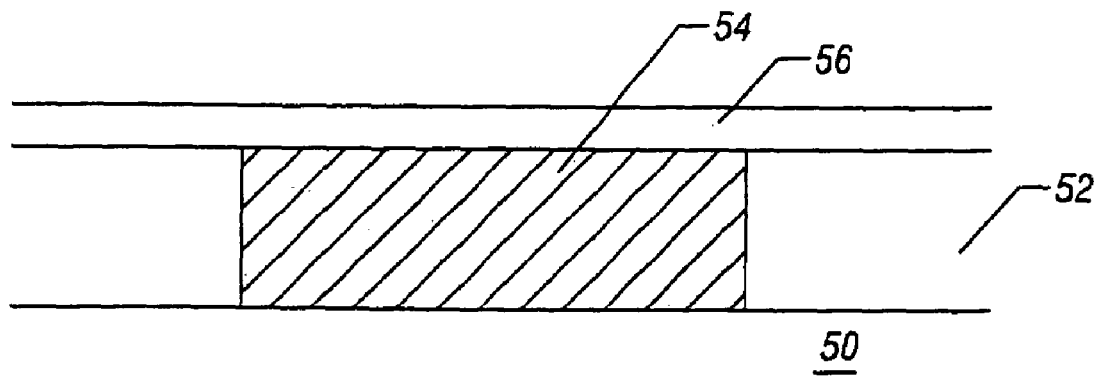
FIG. 5 is an enlarged, cross-sectional view of another embodiment of the present invention.
Figure 6:
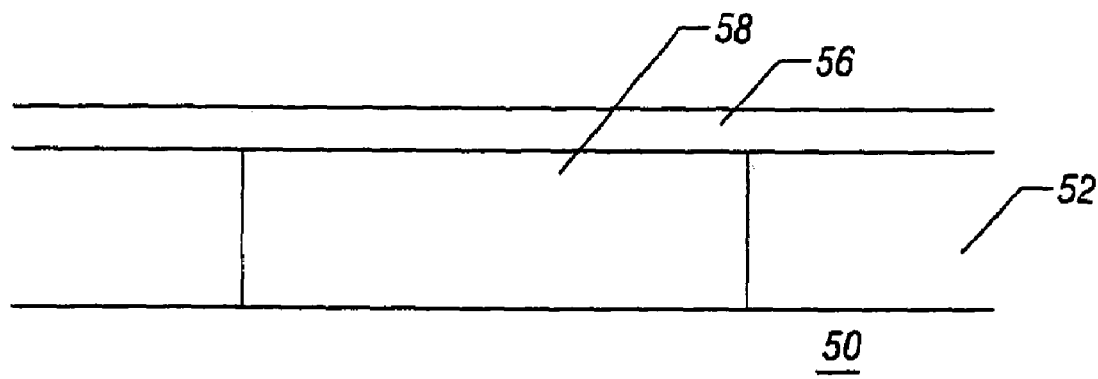
FIG. 6 is an enlarged, cross-sectional view of the embodiment shown in FIG. 5 at a subsequent stage in accordance with one embodiment of the present invention.
Figure 7:
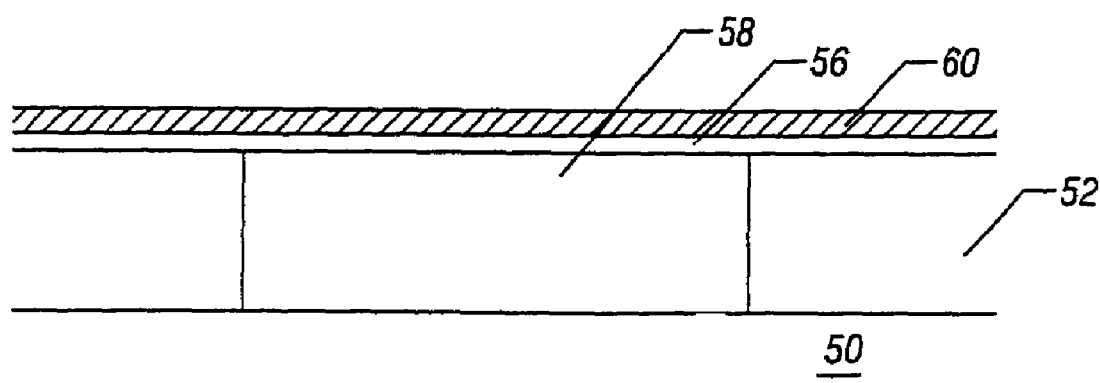
FIG. 7 is an enlarged, cross-sectional view of the embodiment shown in FIG. 5 at a subsequent stage in accordance with one embodiment of the present invention.

In one embodiment, a porous layer 56 may be formed over a sacrificial material 54 in a layer 52 over a substrate 50, as shown in FIG. 5. The porosity of the layer 56 enables the sacrificial material 54 to be evaporated and exhausted through the porous layer 56 in one embodiment, to create a void 58, shown in FIG. 6. Then, the porous layer 56 may be densified to form a substantially non-porous hard mask 60, sealing the void 58 as shown in FIG. 7.

Figure 8:
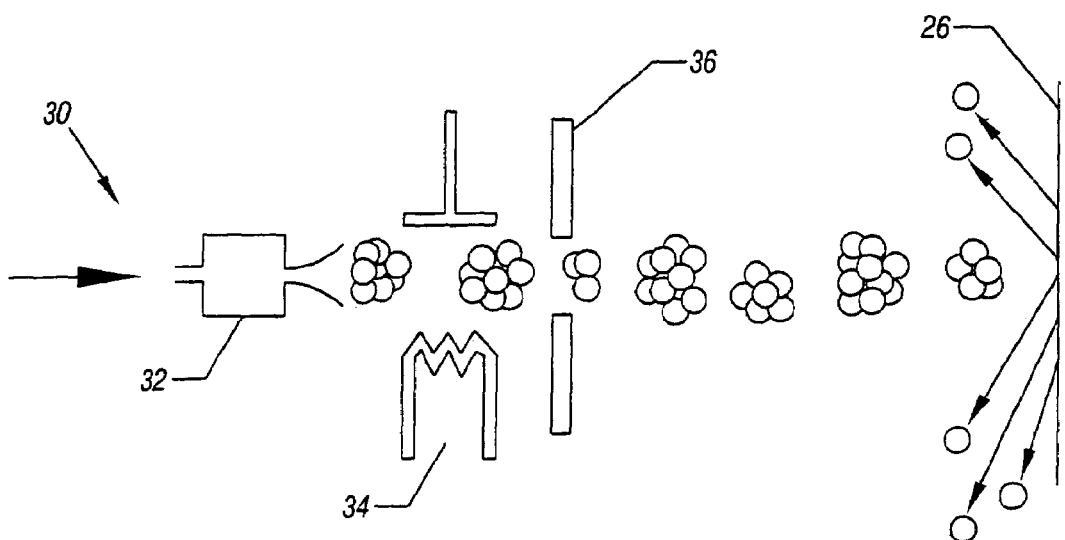
FIG. 8 is a schematic depiction of an apparatus for forming gas cluster ions.

Referring to FIG. 8, a typical gas clustered ion beam is illustrated. The desired gas is provided to a nozzle 32 and ejected by an ionizer 34 and accelerated by an accelerator 36. The accelerated ion clusters then impact the target structure causing densification. The clustered ions may include oxygen ions in one embodiment. As a result, an unlanded via integration scheme may be enabled, as indicated by 22.

The modified structure may result in a hard mask with lower interconnect capacitance since no silicon carbide etch stop layer may be utilized, a simpler etch process for the next metal layer since no separate hard mask is used on top of the next interlayer dielectric layer to etch through to form a via trench, a naturally self-aligned hard mask material, and a smoother copper or copper capped surface, which may have advantages in some embodiments.

Another advantage of using the gas cluster ions is that the total energy of the gas cluster can be high while the energy per atom is quite low. Thus, subsurface damage is reduced and is controllable to less than 20 Angstroms at low cluster energies. The gas cluster ion also tends to smooth the exposed metal surfaces, resulting in a smoother overlying via barrier interface.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming a porous layer; and
    exposing said porous layer to a gas clustered ion beam to densify said porous layer to form a hard mask.

2. The method of claim 1 including using said hard mask to enable an unlanded via integration scheme.

3. The method of claim 1 including using said hard mask in a damascene or dual damascene process.

4. The method of claim 1 including forming said porous layer over a sacrificial layer.

5. The method of claim 4 including removing said sacrificial layer through said porous layer and after removing said sacrificial layer through said porous layer exposing said porous layer to said clustered ion beam to form said hard mask.

6. The method of claim 1 including densifying only a surface region of said porous layer while the remainder of said porous layer below said surface region remains undensified.

7. The method of claim 6 including controlling the thickness of a densified region to approximately 20 Angstroms or less.

8. A semiconductor device comprising:
    a porous layer, said porous layer including an upper surface that has been densified to act as a hard mask and the remainder of said porous layer is undensified.

9. The device of claim 8 wherein said porous layer is formed of an interlayer dielectric.

10. The device of claim 9 wherein said interlayer dielectric includes carbon doped oxide.

11. The device of claim 8 wherein the thickness of the densified layer is controlled to a depth of 20 Angstroms or less.

12. The device of claim 8 including unlanded vias.

13. The device of claim 8 including a damascene or dual damascene structure.

14. The device of claim 8 including an open region under said porous layer.

15. A method comprising:
    forming a porous layer over a sacrificial layer;
    exhausting at least a portion of said sacrificial layer through said overlying porous layer; and
    densifying the porous layer.

16. The method of claim 15 including densifying the porous layer using a clustered ion beam.

17. The method of claim 16 including forming a non-porous region in said porous layer by densifying.

* * * * *